(12) United States Patent
Brunschwiler et al.

(10) Patent No.: US 7,866,173 B2
(45) Date of Patent: Jan. 11, 2011

(54) VARIABLE PERFORMANCE SERVER SYSTEM AND METHOD OF OPERATION

(75) Inventors: Thomas J. Brunschwiler, Thalwil (CH); Ryan J. Linderman, Zurich (CH); Bruno Michel, Adliswil (CH); Erich M. Ruetsche, Pfaeffikon (CH)

(73) Assignee: International Business Machines Corporation, Armonk, NY (US)

( * ) Notice: Subject to any disclaimer, the term of this patent is extended or adjusted under 35 U.S.C. 154(b) by 493 days.

(21) Appl. No.: 12/038,904

(22) Filed: Feb. 28, 2008

(65) Prior Publication Data

US 2009/0234705 A1 Sep. 17, 2009

(51) Int. Cl.
*F25D 17/02* (2006.01)
*H05K 7/20* (2006.01)

(52) U.S. Cl. .................. 62/185; 62/259.2; 361/699; 361/701

(58) Field of Classification Search ............... 62/185, 62/201, 259.2; 361/699, 701, 702; 700/299, 700/300
See application file for complete search history.

(56) References Cited

U.S. PATENT DOCUMENTS

| | | | |
|---|---|---|---|
| 5,768,103 | A | 6/1998 | Kobrinetz et al. |
| 6,216,475 | B1 * | 4/2001 | Sada et al. ............. 62/99 |
| 6,257,329 | B1 | 7/2001 | Balzano |
| 6,313,990 | B1 | 11/2001 | Cheon |
| 6,519,148 | B2 | 2/2003 | Nakagawa et al. |
| 6,587,346 | B1 | 7/2003 | Parker |
| 6,608,751 | B2 | 8/2003 | Ishimine et al. |
| 6,775,997 | B2 | 8/2004 | Bash et al. |
| 6,842,340 | B2 | 1/2005 | Chang |
| 6,945,058 | B2 | 9/2005 | Bash et al. |
| 6,952,346 | B2 | 10/2005 | Tilton et al. |
| 7,072,185 | B1 | 7/2006 | Belady et al. |
| 7,106,590 | B2 * | 9/2006 | Chu et al. ............. 361/701 |

(Continued)

FOREIGN PATENT DOCUMENTS

EP 0766308 A2 2/1997

(Continued)

OTHER PUBLICATIONS

T. Brunschwiler et al., "Direct Liquid Jet-Impingement Cooling With Micron-Sized Nozzle Array and Distributed Return Architecture", 2006, p. 196-203, 0-7803-9524-7/06, IEEE.

(Continued)

*Primary Examiner*—Marc E Norman
(74) *Attorney, Agent, or Firm*—Cantor Colburn LLP; Stephen Kaufman

(57) ABSTRACT

Disclosed herein is a server system having a plurality of computer systems and a liquid cooling system. The computer systems are capable of operating in a first mode of operation at a first operating speed and a first temperature. The computer systems are further capable of operating in a second mode of operation at a second operating speed and a second temperature. The server system switches from the second mode and the first mode in response to a request for processing services rising above a first threshold. The server system further uses a cold battery to store coolant during times of low demand and releases coolant from said cold battery when the system switches to the first mode.

20 Claims, 19 Drawing Sheets

U.S. PATENT DOCUMENTS

| | | |
|---|---|---|
| 7,114,550 B2 | 10/2006 | Nakahama et al. |
| 7,159,414 B2 | 1/2007 | Tilton et al. |
| 7,173,820 B2 | 2/2007 | Fink et al. |
| 2002/0091468 A1 | 7/2002 | Nagashima et al. |
| 2002/0117291 A1 | 8/2002 | Cheon |
| 2003/0035269 A1 | 2/2003 | Chiu |
| 2003/0147214 A1 | 8/2003 | Patel et al. |
| 2003/0158718 A1 | 8/2003 | Nakagawa et al. |
| 2004/0112585 A1 | 6/2004 | Goodson et al. |
| 2005/0168941 A1 | 8/2005 | Sokol et al. |
| 2005/0259397 A1 | 11/2005 | Bash et al. |
| 2006/0065000 A1 | 3/2006 | Belady |
| 2006/0086119 A1 | 4/2006 | Malone et al. |
| 2006/0176665 A1 | 8/2006 | Matsushima et al. |
| 2006/0279935 A1 | 12/2006 | Karidis et al. |
| 2007/0002536 A1 | 1/2007 | Hall et al. |
| 2007/0119565 A1 | 5/2007 | Brunschwiler et al. |
| 2007/0213000 A1 | 9/2007 | Day |
| 2008/0307806 A1 * | 12/2008 | Campbell et al. ............ 62/121 |

FOREIGN PATENT DOCUMENTS

| | | |
|---|---|---|
| EP | 1662852 A1 | 5/2006 |
| WO | 2004042297 A3 | 5/2004 |

OTHER PUBLICATIONS

E. Colgan et al. "A Practical Implementation of Silicon Microchannel Coolers for High Power Chips" IEEE Transactions on Components and Packaging Technologies. Jun. 2007, p. 218-225, vol. 30, No. 2, IEEE.

International Search Report, International Patent Application PCT/IB2009/050477, mailed Aug. 26, 2009, 6 pages.

* cited by examiner

VARIABLE PERFORMANCE SERVER SYSTEM AND METHOD OF OPERATION

BACKGROUND

This disclosure relates to a server system, such as a data center, with computers capable of operating at multiple performance points and in particular to a server system having a first operating point having a high energy efficiency performance and a second operating point having a high processing performance.

Server systems, such as those found in data centers for example, are configured with numerous computers systems that are arranged to provide computer-processing services to users. Typically, the computer systems are arranged in racks that electrically connect the individual computers to the users and other computers. A standard size rack may accommodate up to 40 to 80 computer systems per rack. The computer systems may include a number of components, including one or more processors, micro controllers, semiconductors, memory devices and the like. Each data center may have many racks of computer systems operating simultaneously.

During operation, the computer systems generate significant amounts of thermal energy. Typically, each computer system may generate on the order of 200W-250W of heat. In general, the semiconductors, such as CMOS based semiconductors have faster performance and lower power usage when operated at colder temperatures. Therefore, for reliability and performance reasons, the data centers include extensive cooling systems to dissipate the heat generated by the computer systems. The racks are usually located within a specially designed room that maintains proper environmental conditions by the cooling and conditioning of the room's air. The cooling of the computer systems is accomplished by moving the cool and conditioned air over the computer systems. The air is subsequently removed from the room and reconditioned for subsequent use. The cooling system for the data center may include a number of components. These components include one or more chillers, humidifiers, air conditioning compressors, condensers, fans and pumps.

Data centers are desirable since they have a much higher utilization rate, on the order of 25% when compared to distributed personal computers and servers that typically have a utilization rate of 1-3%. However, the typical data center has an electrical efficiency of only 30% due to the ancillary equipment needed for operations consume the remaining 70% of electrical power used by the data center. Since the computer systems used in the data centers continue to operate at faster speeds, the temperatures at which they operate is also at correspondingly higher. Therefore, the cooling system and power conditioning required for the operation of the data centers will continue to consume an increasingly larger portion of the electrical power used by the data center.

The cooling systems used in the data center are sized to perform under maximum, or worst case situations. Typically, the data center will operate at maximum operating conditions for less than 10% of the time. Therefore, for a large portion of the time, the cooling system is under utilized, but still consuming a large amount of electrical power. The size of the cooling system if further complicated by the thermal resistance between the computer-system components, such as the processor for example, and the air. To provide adequate performance, the cooling system needs to cool the air to provide a 60° C. temperature gradient between the computer processor and the cooling air. Therefore, if the data center desires to operate the computer processor between 75° C.-85° C., the cooling system needs to provide air at a maximum of 25° C. Due to inefficiencies in the distribution of air within the data center, the operating point for the conditioning system needs to be considerably less.

As a result of the complexities of existing data center cooling systems, the data centers have considerable electrical power requirements. A recent study estimates that the waste energy from a medium sized data center is equivalent to almost 3250 MWh of fossil fuel and 630 tons of carbon dioxide per year. In light of treaties entered into to help lower emissions of greenhouse gases, some countries have introduced a tax on carbon monoxide emissions. The tax may be as much as $85 per ton of emissions. These types of programs can have a dramatic impact on the financial viability of a data center.

While existing server systems are adequate for their intended purposes, it is desirable to have server systems that are capable of adapting their operation to provide high performance during peak periods while minimizing energy requirements during the off-peak periods.

SUMMARY

A server system is provided having a computer system. The computer system includes a processor operable at a first speed at a first temperature and at a second speed at a second temperature. A liquid cooling system is fluidly coupled to the processor where the liquid cooling system contains a liquid coolant. A coolant control device is coupled to the liquid cooling system and arranged to control the flow of coolant to the processor. A heat exchanger is coupled to the liquid cooling system. A cold battery is coupled to the liquid cooling system. A controller is operably coupled to the heat exchanger and the cold battery. The controller is further responsive to executable computer instructions to transfer coolant to and from the cold battery in response to a signal indicating the processor is switching between the first speed and the second speed.

A method of operating a server system is also provided. The method includes the step of operating a plurality of computer systems in a first mode of operation wherein the computer systems generate a first thermal load. The method also operates the plurality of computer systems in a second mode of operation wherein the plurality of computer systems generate a second thermal load. Coolant is transferred to the plurality of computer systems at a first flow rate and first temperature when the plurality of computer systems are operating in said first mode. Coolant is transferred to the plurality of computer systems at a second flow rate and second temperature when the plurality of computer systems is operating in the second mode. Finally coolant is transferred from a cold battery when the plurality of computer systems is operating in the first mode.

An alternate method of operating a server system is also provided. This method determines a demand for processing services. A plurality of computer systems is operated at a first mode of operation when the demand for processing services is above a first threshold. The plurality of computer systems further requires coolant at a first temperature when operating in the first mode. The plurality of computer systems is further operated at a second mode operation when the demand for processing services is below the first threshold. The plurality of computer systems can operate with a coolant at a second temperature when operating in the second mode. Coolant is transferred to the plurality of computer systems. Finally, the temperature of the coolant is changed in response to the plurality of computer systems changing between the first mode of operation and the second mode of operation.

DETAILED DESCRIPTION

The use of the terms "a" and "an" and "the" and similar references in the context of describing the invention (especially in the context of the following claims) are to be construed to cover both the singular and the plural, unless otherwise indicated herein or clearly contradicted by context. The modifier "about" used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other.

Figure 1:
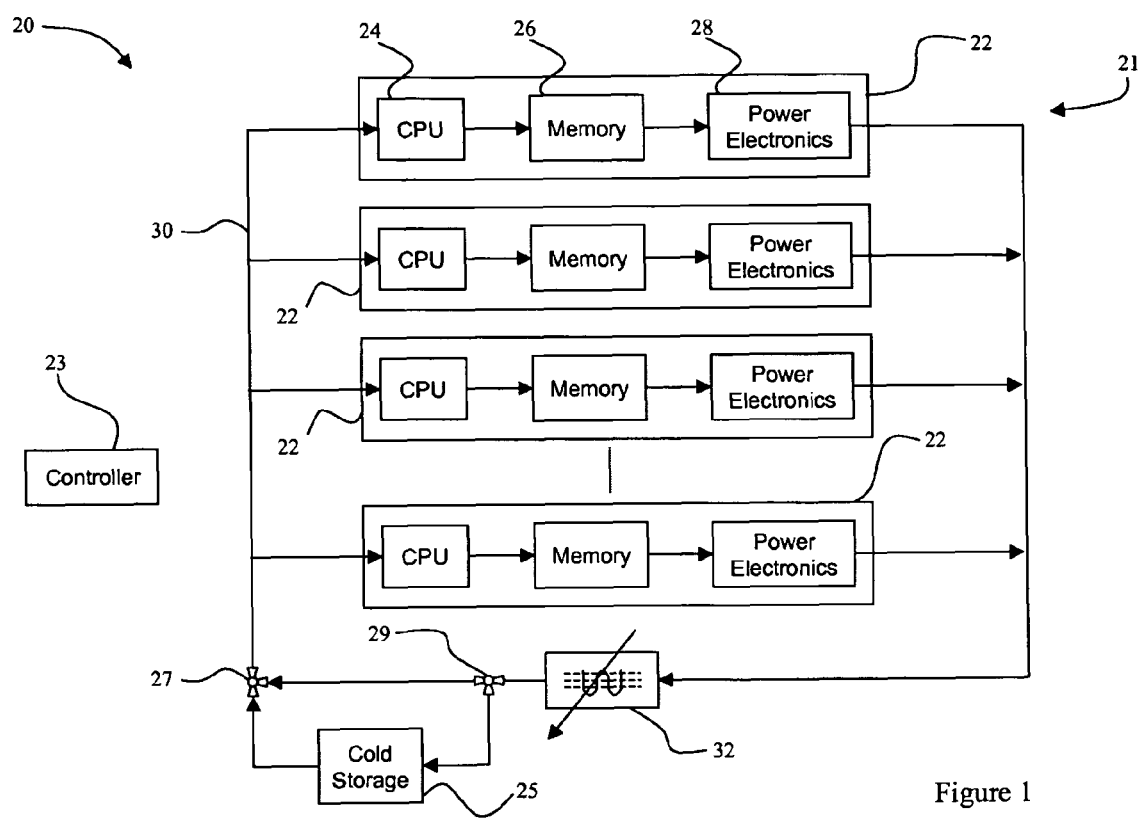
FIG. 1 is a schematic illustration of an exemplary embodiment server system.

With reference now to FIG. 1 an exemplary depiction of a data center 20 having a server system 21 is illustrated. The server system 21 includes a plurality of computer systems 22 that are arranged to provide computer-processing services. Each of the computer systems includes one or more processors 24 and the associated electronic components 26, such as random access memory or read only memory for example, that are commonly used in computer data center systems. Each computer system 22 further includes power electronics 28 that includes components such as dc-power converters that condition the input electrical power to have the electrical characteristics needed by the computer system 22.

It should be appreciated that while only four computer systems 22 are illustrated in FIG. 1, the data center may have any number of computer systems 22, up to 100 racks with 40 computer systems 22 in each rack for example. Further, while the descriptions herein refer to a singular processor, the computer system 22 may include multiple processors. The computer system 22 may also contain a multiple chip module ("MCM"). An MCM is an electronic package including multiple integrated circuits that are packaged together in a manner that allows the system to operate as a single integrated circuit.

As will be discussed in more detail below, each of the computer systems 22 is coupled to a liquid cooling system 30. The cooling system 30 transports a liquid coolant, such as water, glycol or a mixture of water and glycol for example, to each of the computer systems 22. In one embodiment, the cooling system 30 enters the computer system 22 and cools the processor 24 components first. After cooling the processor 24, the memory chips 26 are subsequently cooled. Finally, other electronic components including DC-DC converters 28 are cooled. In this embodiment, the component with the least tolerance for thermal variance (e.g. processor) is cooled first while those components with the highest tolerance for thermal variance (e.g. power converters) are cooled last. In this manner, the cooling system 30 may be sized to maximize the output temperature of the coolant from each computer system 22. This provides advantages in increasing the efficiency of the cooling system 30 and provides the opportunity for further utilization of the generated thermal energy. To ensure a maximal temperature of the coolant a controllable valve (126) is used at the entrance of each computer system which will be closed when the computer systems is switched off and will be fully open when the computer system operates at full power.

The cooling system 30 further includes a heat exchanger 32 that provides a means for removing thermal energy absorbed by the coolant. As will be discussed in more detail below, the use of a liquid cooling system 30 allows a smaller thermal gradient between the coolant and the processor 24. This decrease in thermal gradient eliminates the need to secondary cooling using equipment such as a chiller and allows the thermal energy to be removed using ambient air.

Figure 2A:
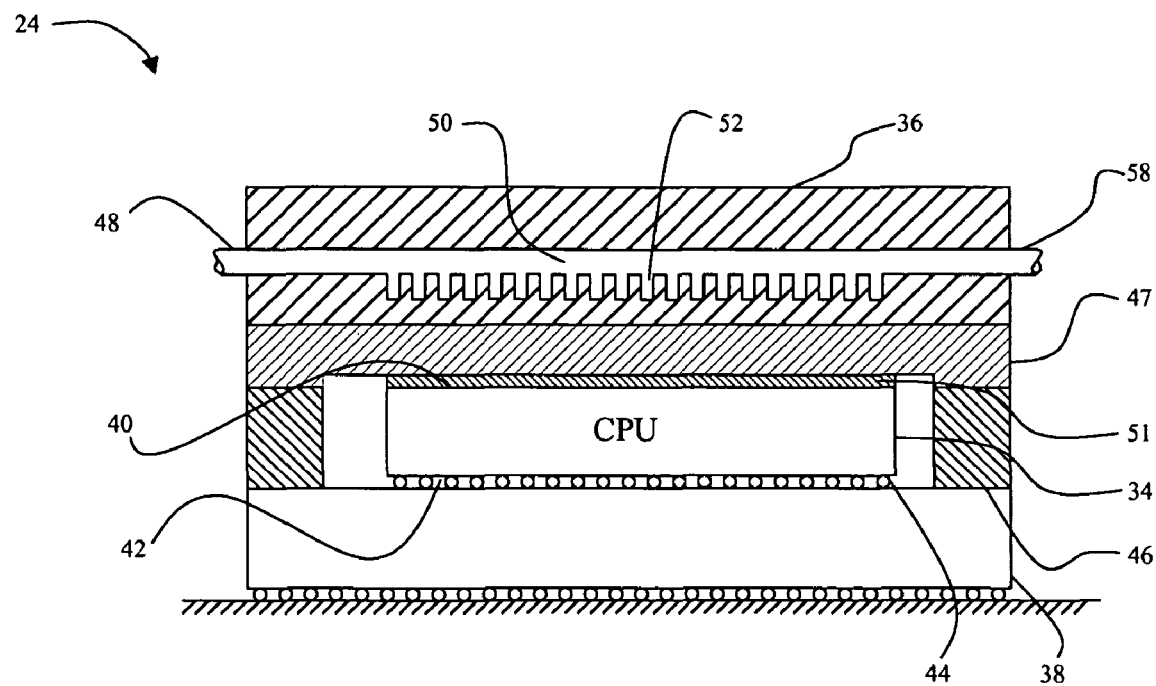
FIG. 2 is side plan view of a liquid cooled processor used in the server system of FIG. 1.
Figure 2B:
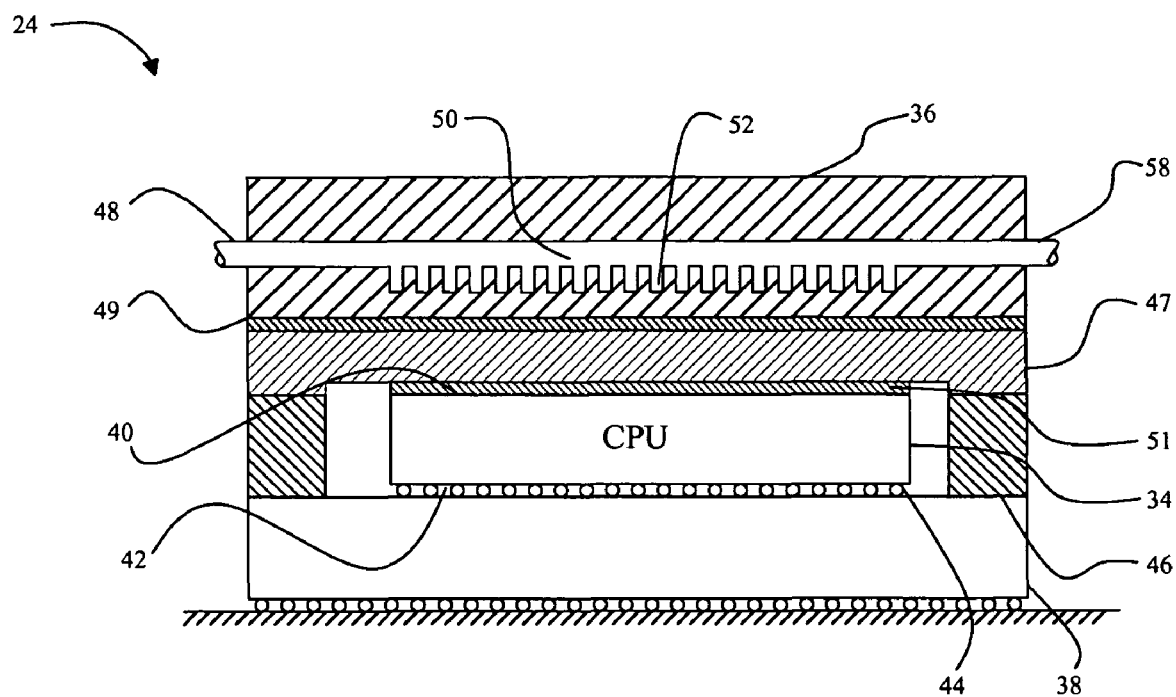

An exemplary embodiment liquid cooled processor 24 is illustrated in FIG. 2. In this embodiment, the processor chip 34 has a first 40 and second 42 face. The first face 40 is in contact and thermal communication with cold place 36. The cold plate 36 is illustrated in FIG. 2A and FIG. 2B as a direct processor chip backside cold plate. It is known to a person skilled in the art that a thermal interface 52 may be arranged between the processor chip 34 and the processor chip cap 47 as shown in FIG. 2A. Alternatively, two thermal interfaces 49, 51 may be used as illustrated in FIG. 2B. In the embodiment of FIG. 2B, a first thermal interface 49 is arranged between the cold plate 36 and the processor chip cap 47. A second thermal interface 51 is arranged between the processor chip 34 and the processor chip cap 47. The second side or active side 42 of processor chip 34 is laterally spaced from a package substrate 38 by a plurality of solder balls 44. A spacer 46 is positioned adjacent the processor chip 34 between the cold plate 36 and the substrate package 38. Similar cold plate arrangements as illustrated in FIG. 2A and FIG. 2B may also be used for cooling of memory chips 26 and power electronic components 28.

Figure 3:
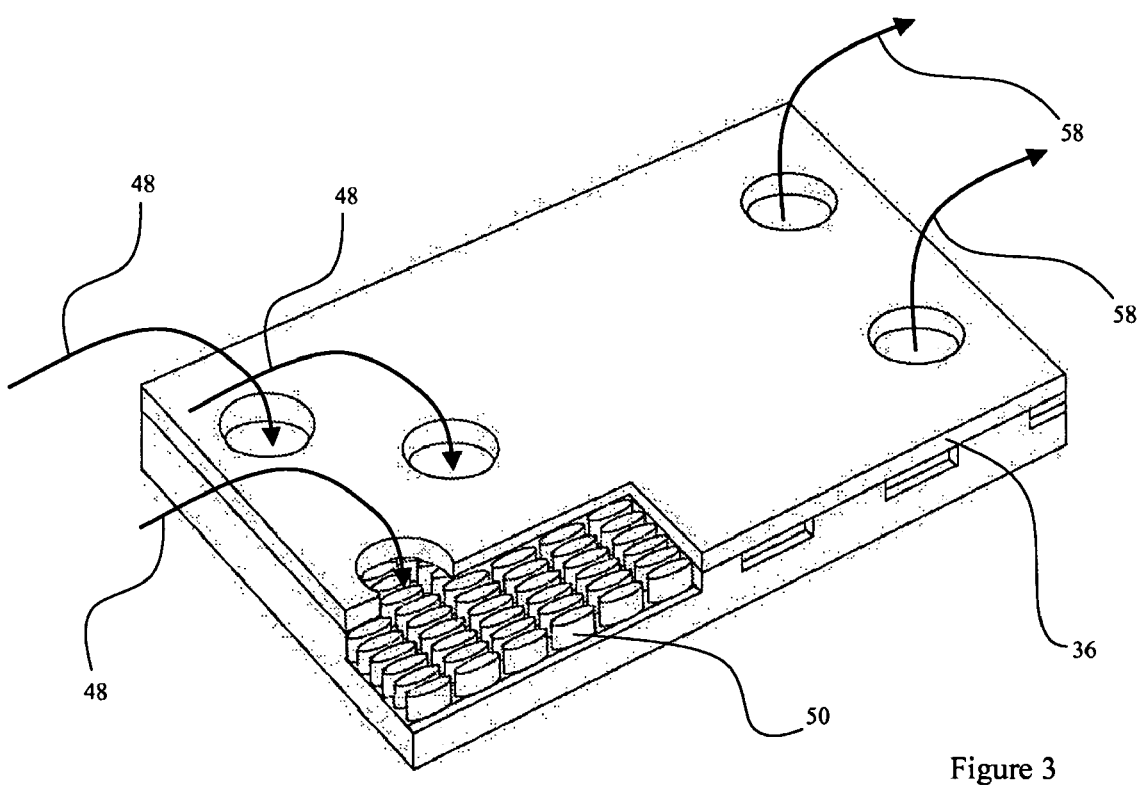
FIG. 3 is a perspective illustration of a cold plate used with the processor of FIG. 2.

The cold plate 36 includes an inlet 48 that is fluidly coupled to receive coolant from the liquid cooling system 30. The coolant enters the cold plate 36 and is distributed over an interior portion 50. The interior portion 50 allows the coolant to flow and cool the first side 40 of the processor chip 34. As illustrated in FIG. 3, the cold plate 36 may include multiple inlets 48 which may optionally be position on the top surface of the cold plate 36. The interior portion 50 may also optionally include fins or divider portions to assist in the transfer of thermal energy and the even distribution of coolant.

Referring now to FIG. 2-6, the liquid cooling of the processor chip 34 will be described. The processor chip 34 generates heat during operation that needs to be dissipated. It is desirable to maintain the processor chip 34 at a junction temperature of approximately 85° C. Since thermal cycling may damage semiconductors and their associated electrical connections, it is further desirable to maintain the chip near a constant temperature. As will be discussed below, due to the low thermal resistance between the processor chip 34 and the coolant, the direct variable flow impingement of coolant on the processor chip 34 allows the cooling system to adequately cool the processor chip 34 with a thermal gradient as small as 3° C. between the operating temperature and the idle temperature.

Figure 4:
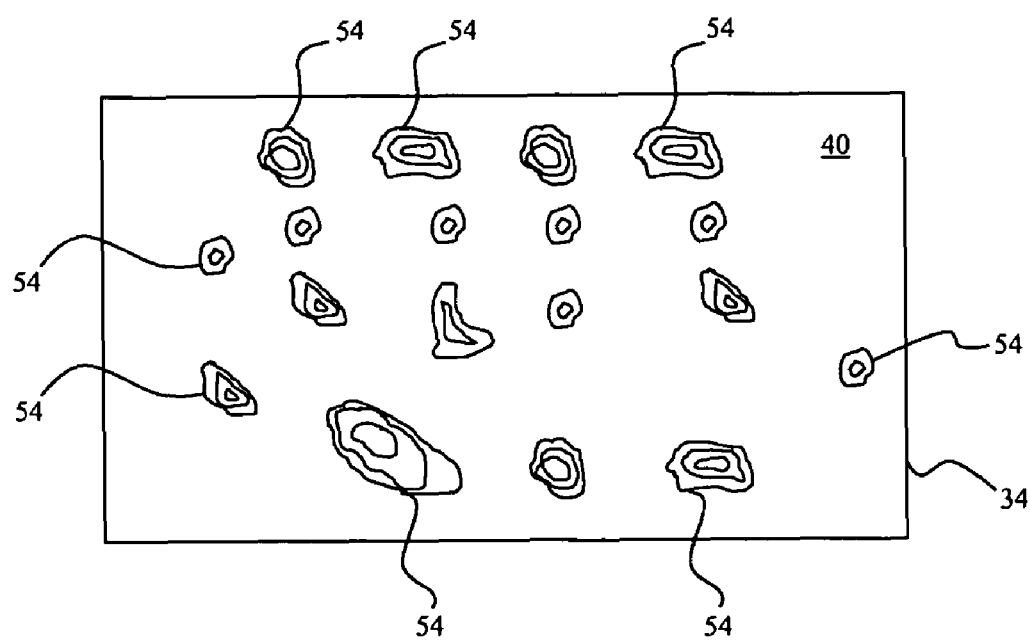
FIG. 4 is an illustration of a power map for the processor of FIG. 2.

The effort to keep the temperature of the processor chip 34 constant and uniform is hampered by the characteristics of the processor chip 34. During operation, the processor chip 34 develops localized hot spots 54. A power map showing the temperature profile of the processor chip is illustrated in FIG. 4 at uniform heat removal. The gradient lines illustrated represent topographic curves of temperature. These localized hot spots 54 further complicate the operation of the processor chip 34 because the processor chip 34 includes transistors (not shown) that operate at different speeds depending on temperature. By having transistors operation at different speeds, the processor chip 34 typically must perform synchronization steps to perform the operations properly.

In the exemplary embodiment, the cold plate 36 includes a plurality of coolant nozzles 52. These nozzles direct the coolant from the interior portion to the processor chip first side 40 and return the fluid to the interior portion 50. To further increase the efficiency of the cooling system 30 and minimize temperature differential across the processor chip 34, the nozzles 52 include a first plurality of nozzles 54 having a first diameter and a second plurality of nozzles 56 having a second diameter. The diameter of the second plurality of nozzles 56 is larger than that of the first plurality of nozzles 54 to allow higher flow rates of coolant. In the exemplary embodiment, the nozzles 52, 56 are spaced between 0.1 mm-0.5 mm apart. In general, as the processor chip 34 becomes thinner, the distance between the nozzles becomes smaller. The diameter of the nozzles is proportional to the local power density and allows lateral temperature gradients on the chip to be reduced to less than 3° C.

Figure 5:
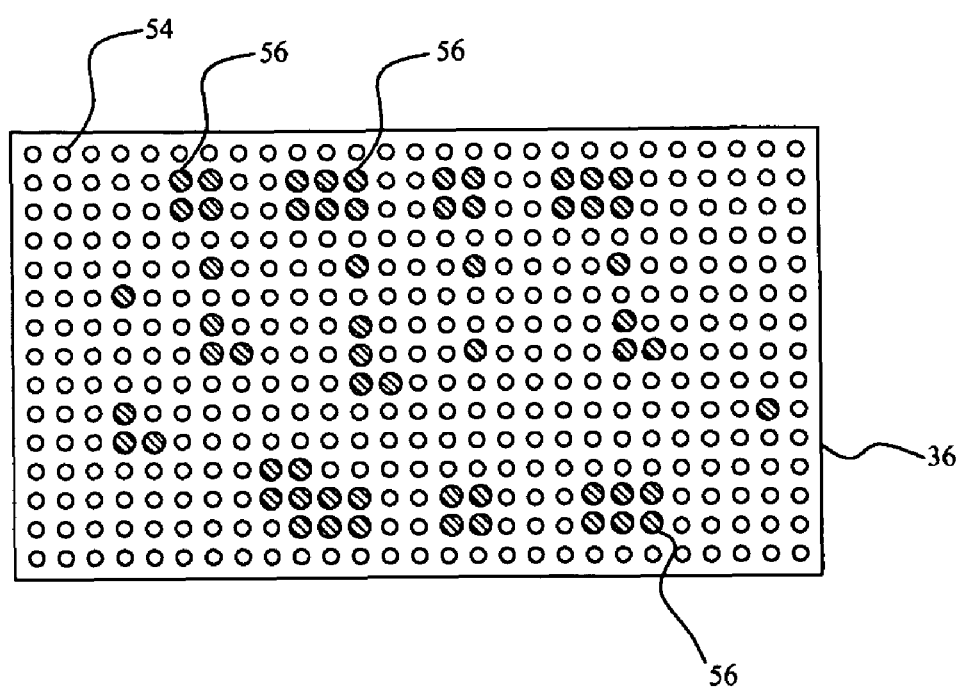
FIG. 5 is a bottom plan view illustration of the exemplary embodiment cold plate used with the processor of FIG. 2.

As illustrated in FIG. 5, the second plurality of nozzles 56 are arranged on the cold plate 36 to be positioned adjacent to the hot spots 54 on the processor chip 34. The cold plate 36 acts as a coolant control device and by arranging the second plurality of nozzles 56 in areas of hot spots 54, higher levels of heat flux may be dissipated. Thus a more uniform junction temperature may be achieved. Where constant coolant flow was used (e.g. all nozzles have the same diameter), a coolant flow of 1.64l/min was needed to provide cooling to the processor chip 34. By utilizing the different nozzle diameters to allow increased flow at the location of hot spots 56, the flow of coolant was reduced to 0.20 l/min for equivalent levels of cooling. Further, since the there was less of a gradient between the coolant exiting the nozzles, the temperature increase of the coolant between the inlet 48 and the outlet 58 rose from 1.0° C. to 8.1° C.

Figure 6:
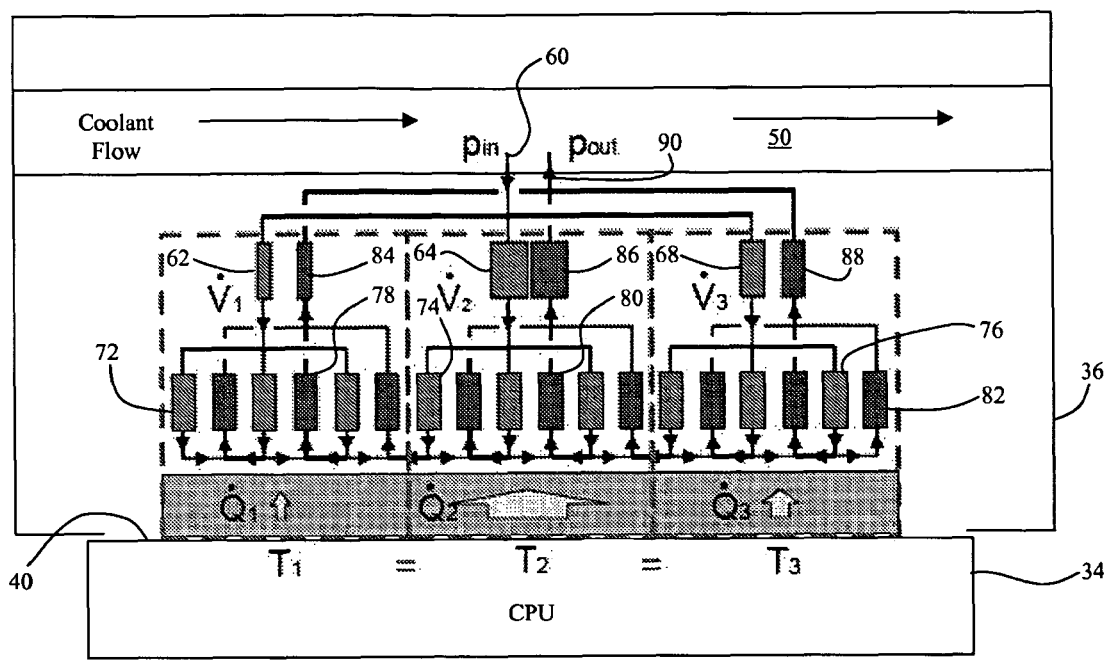
FIG. 6 is a schematic illustration of one embodiment of the liquid cooled processor of FIG. 2.

An alternate embodiment nozzle arrangement is illustrated in FIG. 6. In this embodiment, the nozzles are arranged in a hierarchical manifold with inlet and return nozzles. The coolant exits the interior portion 50 through inlet 60 where it is manifolded into secondary inlets 62, 64, 68. These inlets 62, 64, 68 have different diameters resulting in different flow rates through the respective secondary inlets. Each of the secondary inlets 62, 64, 68 further divides the flow into nozzles 70, 72, 74 that direct the coolant onto the first side 40 of the processor chip 34. A set of return channels 78, 80, 82 return the heated coolant to secondary return channels 84, 86, 88 to outlet 90 that returns the heated coolant to the interior portion 50.

By arranging the nozzles 74 with the highest flow rate $V_2$ to a hot spot 56, the coolant from nozzles 74 provides the a greater thermal transfer $Q_2$ than the lower heat flux regions that are cooled by the other nozzles 72, 78. Is should be appreciated that by arranging the flow rates such that $V_2 > V_3 > V_1$, the respective junction temperature are similar, even at $Q_2 > Q_3 > Q_1$. However, as a result, the temperature on the side 40 of the processor chip 34 remains constant, such that $T_2 = T_3 = T_1$. Further, due to the differences in the flow rates, the temperature differences between the coolants exiting the respective secondary return channels 84, 86, 88 are smaller improving exergy efficiency.

Figure 7:
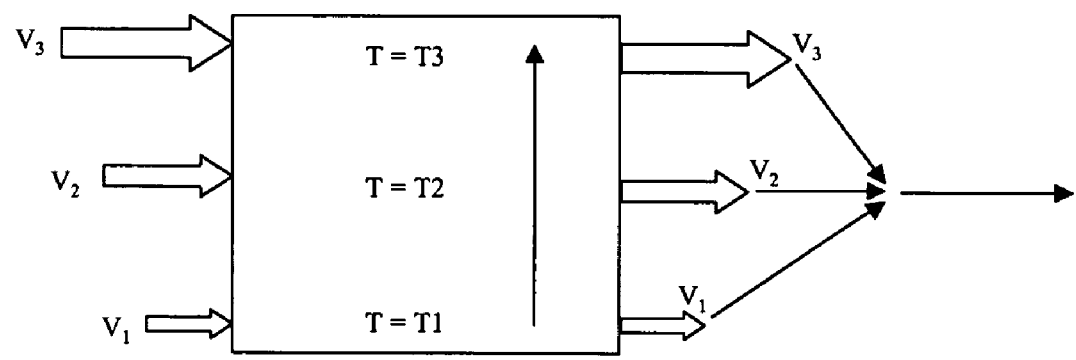
FIG. 7 is schematic illustration of one embodiment of coolant flow across the processor of FIG. 2.
Figure 8:
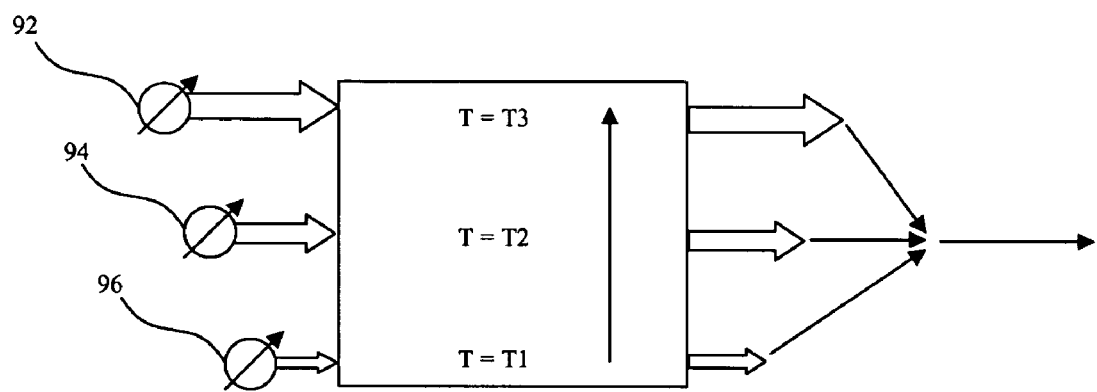
FIG. 8 is a schematic illustration of an alternate embodiment of coolant flow across the processor of FIG. 2.

The effect of having different flow rates is further illustrated in FIGS. 7-8. These figures schematically illustrate the temperature gradient over the surface of the processor chip 34 where $Q_3 > Q_2 > Q_1$. The respective levels of low rates of the coolant are $V_3 > V_2 > V_1$. The high flow rates are directed to static regions with expected high load conditions. As a result of this arrangement, higher flow rate $V_3$ absorbs more thermal energy, however, the existing temperature of the coolant remains close or the same as the lower flow rate $V_1$. In other words, the thermal transfer per unit of coolant volume remains the same across the surface of the processor chip 34.

FIG. 8 illustrates a lightly different embodiment that utilizes active or passive proportional valves 92, 94, 96. The use of a proportional valve allows for the dynamic changing of the flow rates of coolant to the processor chip 34. Therefore, as load conditions change and different regions of the processor chip 34 become active, the flow rates of coolant may be correspondingly changed. The changing of the flow rates may be accomplished in a number of ways, for example, a controller in the cooling system may include a set of power maps indicating the temperature gradients and localized hot spots under the expected operating conditions. As the controller detects a change in the operation of the processor chip 34, the controller uses the power map associated with the new load condition. In the exemplary embodiment, the controller includes at least 100 power maps having data representing temperatures and/or desired flow rates to the processor chip 34. In one embodiment, the controller includes two power maps, one for peak load performance, and one for off-peak loads.

The providing variable flow rates of coolant to the processor chip 34, lower flow rates of coolant are required. This provides advantages in the operation of the computer system 22 and the data center 20. Lower flow rates conserves pumping power, preserves exergy and allows more uniform chip temperature. As should be appreciated, a more uniform chip temperature reduces the thermal cycling of the processor chip and also minimizes the speed differences between the processor chip's 34 transistors. In the exemplary embodiment, the processor chip 34 temperature is maintained at a constant temperature with a thermal gradient of 3° C. between operating and idle states. This provides further advantages in allowing a reduction in the supply voltage and a reduction in the leakage currents that have exponential temperature dependence.

In addition to the processor 24, other components within the computer system 22 require cooling to dissipate generated heat. One of these components is the group of ancillary electrical components 26 that support the operation of processor 24. In general, the junction temperature limits of the ancillary electrical components 26 are higher than that of the processor 24 while also having a lower heat flux. For example, a processor at 85° C. has a local heat flux of up to 300W/cm$^2$, while a DC-DC converter has a maximum temperature of 115° C. at 20 W/cm$^2$. By taking advantage of the thermal characteristics of the cooling system 30 may be arranged to remove thermal energy serially to maximize the output coolant temperature from the computer system 22.

Figure 9:
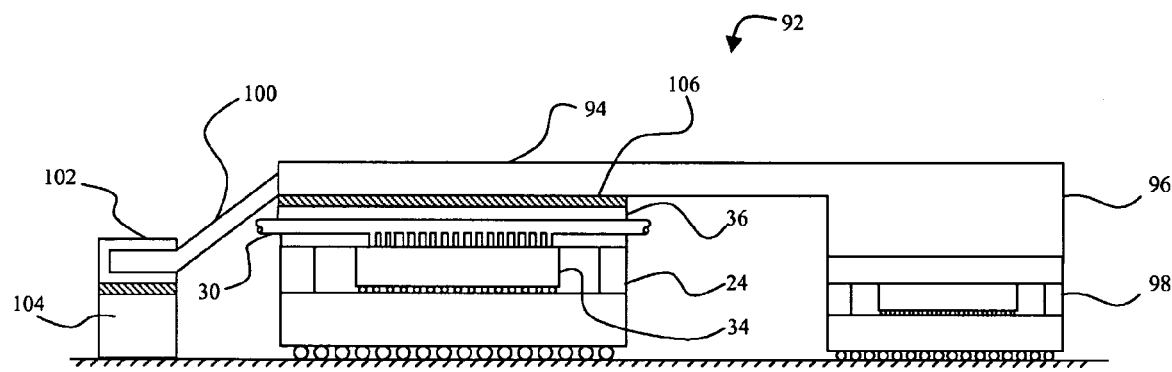
FIG. 9 is a side plan view of a computer system cooling system using a conductive collector.

One embodiment of a thermal cooling loop 92 within the computer system 22 is illustrated in FIG. 9. In this embodiment, the processor 24 is liquid cooled by cooling system 30 discussed above. A conductive collector 94 is coupled to the cold plate 36 opposite from the processor chip 34. The conductive collector may be any suitable material such as a metal that is thermally conductive. The conductive collector 94 has a second portion 96 that is coupled in thermal communication with a heat sink on ancillary electrical component 98. The conductive collector 94 further has a third portion 100 coupled to a heat sink 102 on another ancillary electrical component 104. An optional thermal interface material 106, such as thermal grease, may be arranged between the cold plate 36 and the conductive collector 94.

Owing to its contact with the cold plate 36, the conductive collector 94 will transfer thermal energy from the ancillary electrical components 98, 104 to the cold plate 36. Since the conductive collector 94 is less efficient than the liquid cooling of the processor chip 34, the thermal transfer to the backside of the cooling plate 36 will be more moderate than between the cooling plate 36 and the processor chip 34. This arrangement enables to provide adequate cooling to the ancillary electrical components 26 while maintaining the processor chip 34 at a constant temperature. It should be appreciated that while FIG. 9 shows the conductive collector 94 as being coupled to two ancillary components 98, 104, the embodiment is not so limited and an the conductive collector may be expanded to be in thermal communication with all ancillary electrical components that need cooling.

Figure 10:
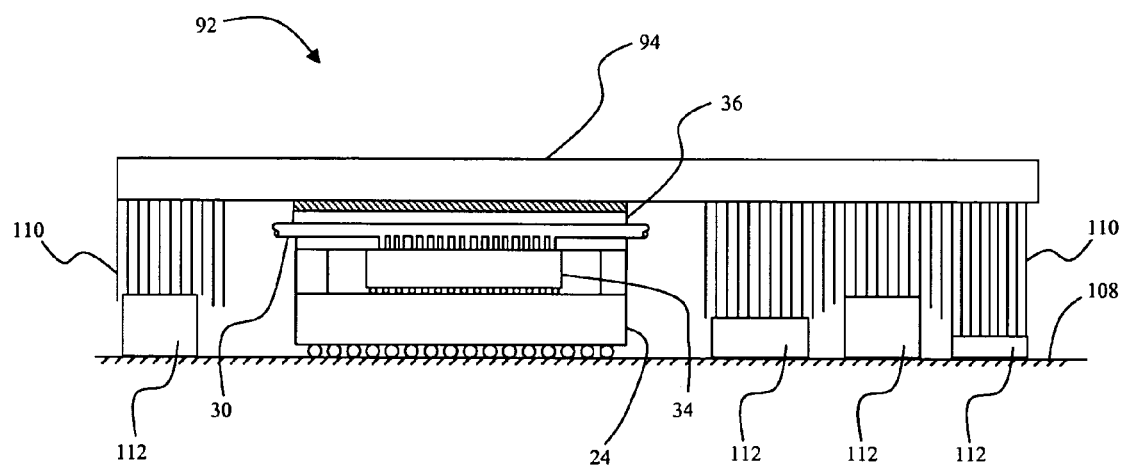
FIG. 10 is side plan view of an alternate embodiment computer cooling system using a conductive collector with a heat collector.

An alternate embodiment thermal cooling loop 92 is illustrated in FIG. 10. In this embodiment, the conductive collector 94 is coupled and in thermal communication with the cold plate 36 as described above. The conductive collector 94 is configured in a planer manner parallel to the plane of the substrate 108 on which the processor 24 and electrical components 26 are mounted. Extending from the bottom side of the conductive collector is a heat collector 110. The heat collector 110 extends into thermal communication with each of the electrical components 112. The heat collector 110 may be any suitable material, including metal fins, metallic foam or springs for example, that can comply to the different surface heights of components and is capable of conducting thermal energy from the electrical components 112 to the conductive collector 94. It should be appreciated that the heat collector 110 may be coupled to the conductive collector 94 to allow ease of serviceability and maintenance.

Figure 11:
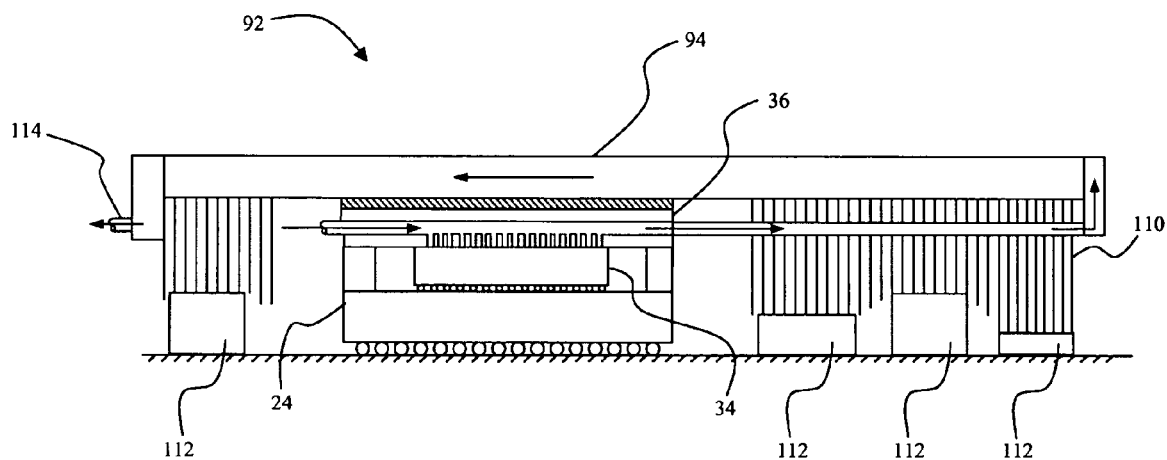
FIG. 11 is a side plan view of another alternate embodiment computer cooling system with a liquid cooled conductive collector.

FIG. 11 illustrates another alternate embodiment thermal cooling loop 92. In this embodiment, the conductive collector 94 and heat collector 110 are arranged as discussed above with reference to FIG. 10. The cooling system 30 extends past the processor 24 into contact and thermal communication with the heat collector 110. The liquid coolant than continues back through the conductive collector 94 and exits via outlet 114. By extending the liquid coolant system 30 into the heat collector 110, the thermal resistance form the electrical components to the coolant is less allowing higher coolant temperature.

Figure 12:
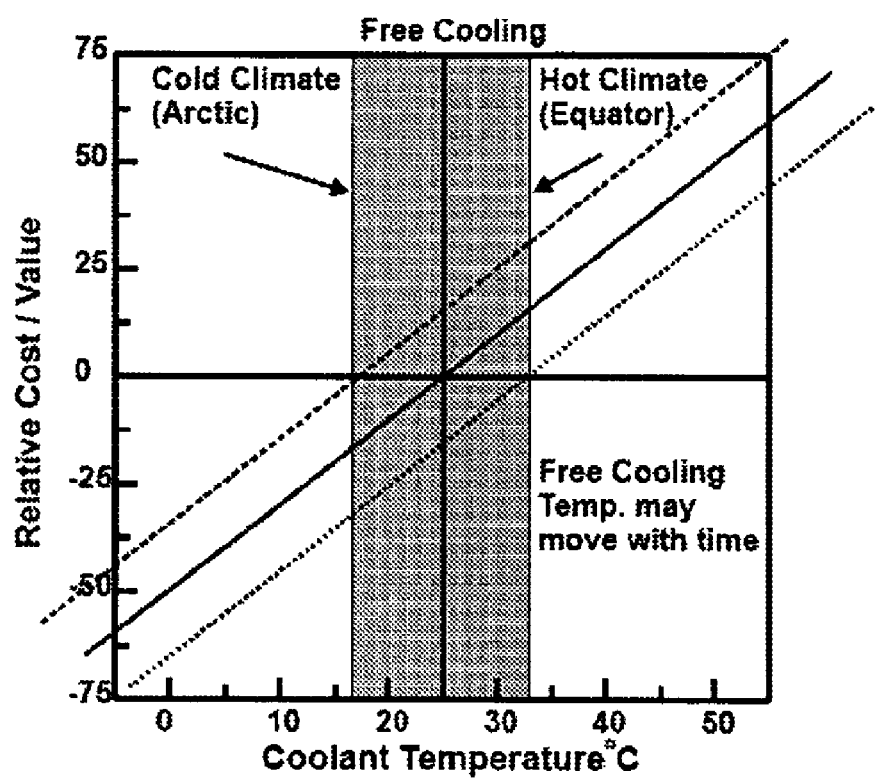
FIG. 12 is a graph illustrating the relative cost of cooling vs coolant temperature.

The embodiments illustrated in FIGS. 1 and 11 provide for a serial cooling of the processor 24 and the electrical components 26. As shown in FIG. 1, the coolant system then comes into thermal communication with the power electronics 28. This serial arrangement allows for an efficient cooling of the computer system 22 and provides a coolant with a desirable exit temperature as well. In the exemplary embodiment, the coolant enters that computer system 22 at a temperature 28° C. less than the junction temperature of the processor chip 34. Thus where the junction temperature is desired to be 85° C., the coolant need only enter at 57° C. In the exemplary embodiment, the coolant has an inlet temperature of 45° C. and a processor chip junction temperature of 69° C. The resulting exit temperature from the processor chip 34 is 49° C. The coolant then flows to the group electrical components 26, absorbs additional thermal energy, and rises further to 51° C. Finally, the power electronics 28 are cooled and the coolant outlet temperature is 53° C. Since the average ambient temperature, also known as the free cooling temperature, is less than 30° C., the chiller that was required by the prior art may be eliminated. As illustrated in FIG. 12, the free cooling temperature varies between approximately 17° C. in arctic climates and 33° C. in equatorial climates. Peak temperatures during hot seasons and at daytime can be higher than the average values given in FIG. 12 but a coolant output temperature of 53° C. would even allow free cooling at exceptional ambient temperatures of 48° C. Thus, the exit temperature of the coolant in the exemplary embodiment may be cooled without a chiller in virtually any environment. It should be appreciated that this provides an advantage over prior art air-cooled systems that required the cooling air to be cooled to a temperature of 14° C. and had large thermal gradients between operating and idle states. With prior art systems, if free temperature cooling was available, was so only a small portion of the year.

This temperature differential between the free cooling temperature and the output temperature of the coolant from the computer system creates an opportunity to make additional usage of energy that had previously been waste heat. In prior art data center cooling systems, the usage of the heat generated was not commercially compelling since output fluid temperature of the air cooled systems was not of sufficient quality (e.g. fluid temperature was too low) to be used for process or residential heating. Typically, a prior art system would need a device, such as a heat pump for example, that would raise the temperature of the waste heat. This additional equipment further increased the inefficiencies of the prior art systems. However, where the waste heat temperature differential is 20° C. or greater than the free cooling temperature, the generated heat may be captured and further utilized.

In metropolitan areas, it is not uncommon for a central boiler system to be used to generate heat for consumers of thermal energy, such as commercial facilities, industrial facilities, industrial processes or residences in the surrounding area. This heating system is sometimes referred to as district heating or teleheating. The hot water is transported via insulated pipes to subscribing buildings, which purchase the hot water. Modern district heating systems use hot water with temperatures of 50° C.-60° C. It should be appreciated that purchasing of hot water for heating purposes from a centralized location provides for greater efficiency and a larger utilization of the energy source over distributed heating arrangement. The use of a centralized heat source also provides the opportunity to offset carbon emissions that would have otherwise been generated by the buildings served by the district heating system.

The ability to operate the computer systems 22 on a higher inlet coolant temperature provides further opportunities to operate the server system 21 in a more efficient manner. Typically, the data center 20 needs to have sufficient capacity to meet coolant requirements for peak performance time periods. This peak time period typically only last a few minutes to one hour per day. During the remaining portions of the day, the cooling requirements are considerably less. As will be discussed in more detail below, the ability to utilize free temperature cooling enables the design of a cooling system with a capacity closer to that needed during the off-peak time periods. This is accomplished by using the lower ambient air temperatures during times of the day, such as during the evening, to store a reservoir of coolant that can be used to offset heat loads created during peak demand periods.

Figure 13:
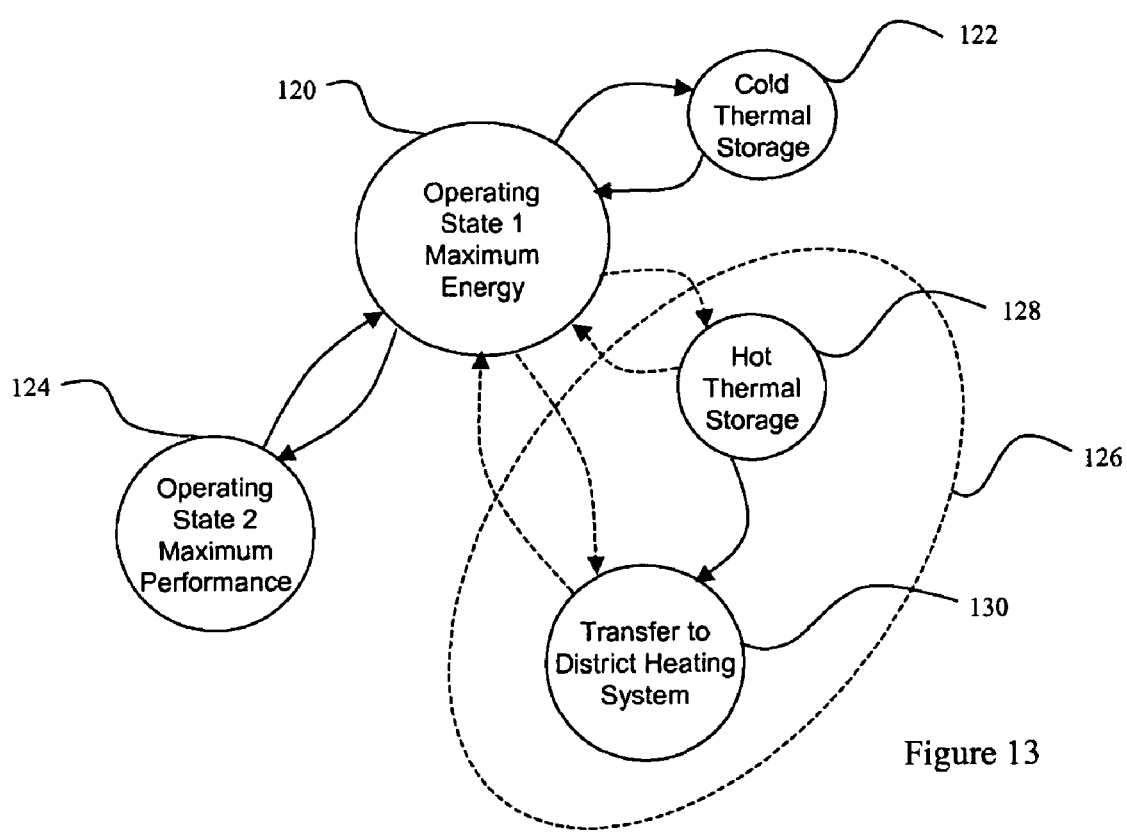
FIG. 13 is a schematic illustration of different operational states of server system of FIG. 1.

Referring now to FIG. 13, an exemplary embodiment of the operational states for controller 23 is illustrated. In this embodiment, the controller operates a majority of the time in operating state 1 which is represented by circle 120. While in State 120, the controller maintains an adequate flow of coolant to the computer systems 22 to maintain the processor chip 34 at an adequate temperature (e.g. 85° C.) while obtaining a desired exit coolant temperature (e.g. 52° C.). The controller 23 balances a number of factors, such as the expected load demand on the computer systems 22, the cost of energy (since warmer processor chips 32 consume more electricity), the power requirements of the server system 21, the thermal demand from a third party user, such as a district heating system, and the price in which the generated hot coolant could be sold. By balancing these factors, the controller 23 can change the flow rate of the coolant to achieve maximum or optimal exergy efficiency under the operating conditions. For example, if thermal demand is low, or the price of the hot coolant is low, then the controller may determine that it is more cost effective and efficient to run the processor chip 34 at a lower temperature resulting in a lower exit coolant temperature. The controller may further balance additional factors such as the difference between the thermal time constant of the cooling plate versus the thermal time constant of the cooling system actuators. In the case of high performance cold plates, the time constant of the cold plate may be smaller than that of the cooling system actuators. In this scenario, the controller may adjust the temperature of the coolant prior to switching between State 120 and State 124.

It should be appreciated that the server system 21 may also utilize techniques such as virtualization that allow processes to be shifted between computer systems to maximize utilization of the server system 21. This shifting allows less utilized computer systems to be shut down. In the example given above, the operation of the processor chips 34 at lower temperatures may enable the virtualization to occur allowing the server system 21 to shut down one or more of the computer systems 22.

It should be appreciated that during off-peak periods, there will still be time periods (e.g. night time) when the combination of the server system 21 loading and the ambient air temperature will result in excess capacity in the cooling system 30. When the controller detects, or anticipates, that excess capacity is available, the controller 21 shifts to Cold Thermal Storage mode 122. As will be discussed in more detail below, mode 122 utilizes an auxiliary storage arrangement, sometimes referred to as a cold battery for example, to capture this excess capacity. Mode 122 diverts a portion, or the entirety, of the coolant into a reservoir for later use. The coolant in the reservoir may have its temperature reduced by a cooler (e.g. a roof cooler), a chiller, or may simply be placed in a storage tank and allowed to cool during the off peak periods.

During peak times of the day, the demand for processing services on the server system 21 will exceed a threshold L1 where higher performance, meaning cooler processor chips 34, is needed. The threshold L1 may be determined in a number of ways, by the electrical power consumed by computer systems 22 for example. When the controller 23 detects, or anticipates such a peak period, the controller 23 shifts to Operating State 2 represented by circle 124. State 124 shifts its focus from maximizing exergy to maximizing performance of the server system 21. The performance of the processor chip 34 increases as the junction temperature is decreased. For example, by decreasing the input coolant temperature from 45° C. to 20° C., the processor chip 34 junction temperature drops to 60° C. This lowering of the junction temperature allows to increase the overall power dissipation of computer systems 22 by a factor of 1.5 to 2. This then leads to a higher thermal gradient from junction to coolant output temperature of 40° C. instead of 20° C. Thus with an inlet temperature of 20° C., a coolant heating of 8° C. and a chip to coolant temperature gradient of 40° C. the chip temperature can be maintained at 68° C. With the cooler temperature and the higher supply voltage the clock rate of the chips can be increased by approximately 50%. Therefore, upon entering State 124, controller 23 seeks to lower the coolant temperature. This may be accomplished in a number of ways, by activating an auxiliary chiller for example. In the exemplary embodiment, using coolant stored in a cold battery during off peak periods decreases the coolant temperature. Since the coolant output temperature in high performance mode is too low (48° C.) the output energy cannot be fed into the district heating system but needs to be disposed of. During this time a hot battery provides the energy for re-use in case there is demand from the district heating system.

In certain alternate embodiments, controller 23 has an optional heat utilization state 126. State 126 includes two states, a hot thermal storage state 128, and a district heating state 130. In state 128, hot coolant is transferred to a storage device, sometimes referred to as a hot battery for example, for later use. For example, during State 124, the thermal demands of a district heating system may be greater than the cooling system 30 can provide due to the need to maximize performance (which impacts the exit coolant temperature). To supplement the thermal transfer to the district heating system, thermal energy may be transferred from the hot battery. The hot battery may be any suitable heat storage medium, including but not limited to water or a rock tank. The second mode 130 allows the transfer of thermal energy from the cooling system 30, via the heat exchanger 32 for example, to a district heating system that may include residences or commercial facilities. If should be appreciated the some of the secondary modes of operation, such as cold thermal storage 122, hot thermal storage 128 and transfer mode 130, may operate simultaneously with State 120 and State 124.

Figure 14:
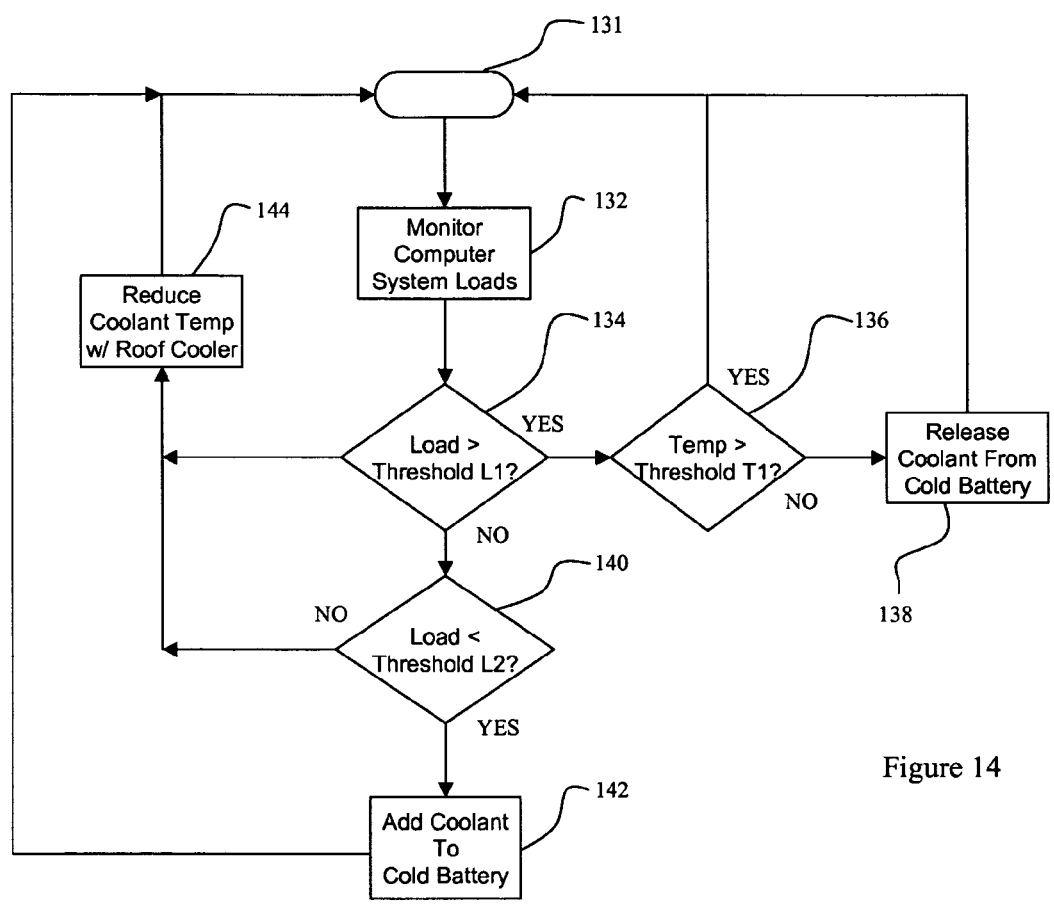
FIG. 14 is a flow chart illustrating the operation of the cooling system for the server system of FIG. 1.

Controller 21 is electrically coupled to monitor the operation of the cooling system 30 and perform the operational states 120, 122, 124, 126 discussed above. The controller 21 is a suitable electronic device capable of accepting data and instructions, executing the instructions to process the data, and presenting the results, including those processes illustrated in the flow charts shown in FIG. 14, FIG. 16 and FIG. 18. The controller 21 may include one or more processors.

Controller 21 may accept instructions through a user interface, or through other means such as but not limited to electronic data card, voice activation means, manually operable selection and control means, radiated wavelength and electronic or electrical transfer. Therefore, controller 21 can be a microprocessor, microcomputer, a minicomputer, an optical computer, a board computer, a complex instruction set computer, an ASIC (application specific integrated circuit), a reduced instruction set computer, an analog computer, a digital computer, a molecular computer, a quantum computer, a cellular computer, a superconducting computer, a supercomputer, a solid-state computer, a single-board computer, a buffered computer, a computer network, a desktop computer, a laptop computer, a personal digital assistant (PDA) or a hybrid of any of the foregoing.

Controller 21 is capable of converting the analog voltage or current level provided by sensors, such as temperature sensors for example, into a digital signal indicative of the heat generated by the computer system 22 or return water temperature from a district heating system. Alternatively, sensors may be configured to provide a digital signal to controller 21, or an analog-to-digital (A/D) converter maybe coupled between sensors and controller 21 to convert the analog signal provided by sensor into a digital signal for processing by controller 21. Controller 21 uses the digital signals as input to various processes for controlling the cooling system 30. The digital signals represent one or more cooling system 30 data including but not limited to flow rates through coolant control devices and the like.

Controller 21 is operably coupled with one or more components of data center 20 by data transmission media. Data transmission media includes, but is not limited to, solid-core wiring, twisted pair wiring, coaxial cable, and fiber optic cable. Data transmission media also includes, but is not limited to, wireless, radio and infrared signal transmission systems. Controller 21 communicates over the data transmission media using a well-known computer communications protocol such as Inter-Integrated Circuit (I2C), Serial Peripheral Interface (SPI), System Management Bus (SMBus), Transmission Control Protocol/Internet Protocol (TCP/IP), RS-232, ModBus, or any other communications protocol suitable for the purposes disclosed herein.

In general, controller 21 accepts data from sensors, such as temperature sensors for example, and devices such valves or other coolant control devices for example. Controller 21 is also given certain instructions from an executable instruction set for the purpose of comparing the data from sensors to predetermined operational parameters such as a desired coolant exit temperature. Controller 21 provides operating signals to operate coolant control devices for example. Controller 21 may also accept data from district heating system, indicating, for example, whether the heat demand from users on the system is increasing or decreasing. The controller 21 compares the operational parameters to predetermined variances (for example, coolant temperature, processor operating state, heat demand) and if the predetermined variance is exceeded, generates a signal that may be used to indicate an alarm or message to an external device. Additionally, the signal may initiate other control methods that adapt the operation of the cooling system 30 such as changing the operational state of coolant control device to compensate for the out of variance operating parameter.

Controller 21 includes a processor coupled to a random access memory (RAM) device, a non-volatile memory (NVM) device, a read-only memory (ROM) device, one or more input/output (I/O) controllers, and a data interface device. I/O controllers may also be coupled to one or more analog-to-digital (A/D) converters, which receive analog data signals from sensors.

A data interface device provides for communication between controller 21 and an external device, such as a computer, a laptop or a computer network for example, in a data communications protocol, such as but not limited to USB (universal serial bus) or JTAG (point test action group) for example, supported by the external device. ROM device stores an application code, e.g., main functionality firmware, including initializing parameters, and boot code, for processor. Application code also includes program instructions for causing processor to execute any operation control methods, including starting and stopping operation, changing coolant control devices, monitoring predetermined operating parameters such as measurements by sensors and generation of data signals.

An NVM device is any form of non-volatile memory such as an EPROM (Erasable Programmable Read Only Memory) chip, a flash memory chip, a disk drive, or the like. Stored in NVM device are various operational parameters for the application code. The various operational parameters can be input to NVM device either locally, using a user interface (not shown) or remotely via the data interface. It will be recognized that application code can be stored in NVM device rather than ROM device.

Controller 21 includes operation control methods embodied in application code. These methods are embodied in computer instructions written to be executed by processor, typically in the form of software. The software can be encoded in any language, including, but not limited to, machine language, assembly language, VHDL (Verilog Hardware Description Language), VHSIC HDL (Very High Speed IC Hardware Description Language), Fortran (formula translation), C, C++, Visual C++, Java, ALGOL (algorithmic language), BASIC (beginners all-purpose symbolic instruction code), visual BASIC, ActiveX, HTML (HyperText Markup Language), and any combination or derivative of at least one of the foregoing. Additionally, an operator can use an existing software application such as a spreadsheet or database and correlate various cells with the variables enumerated in the algorithms. Furthermore, the software can be independent of other software or dependent upon other software, such as in the form of integrated software.

Figure 15:
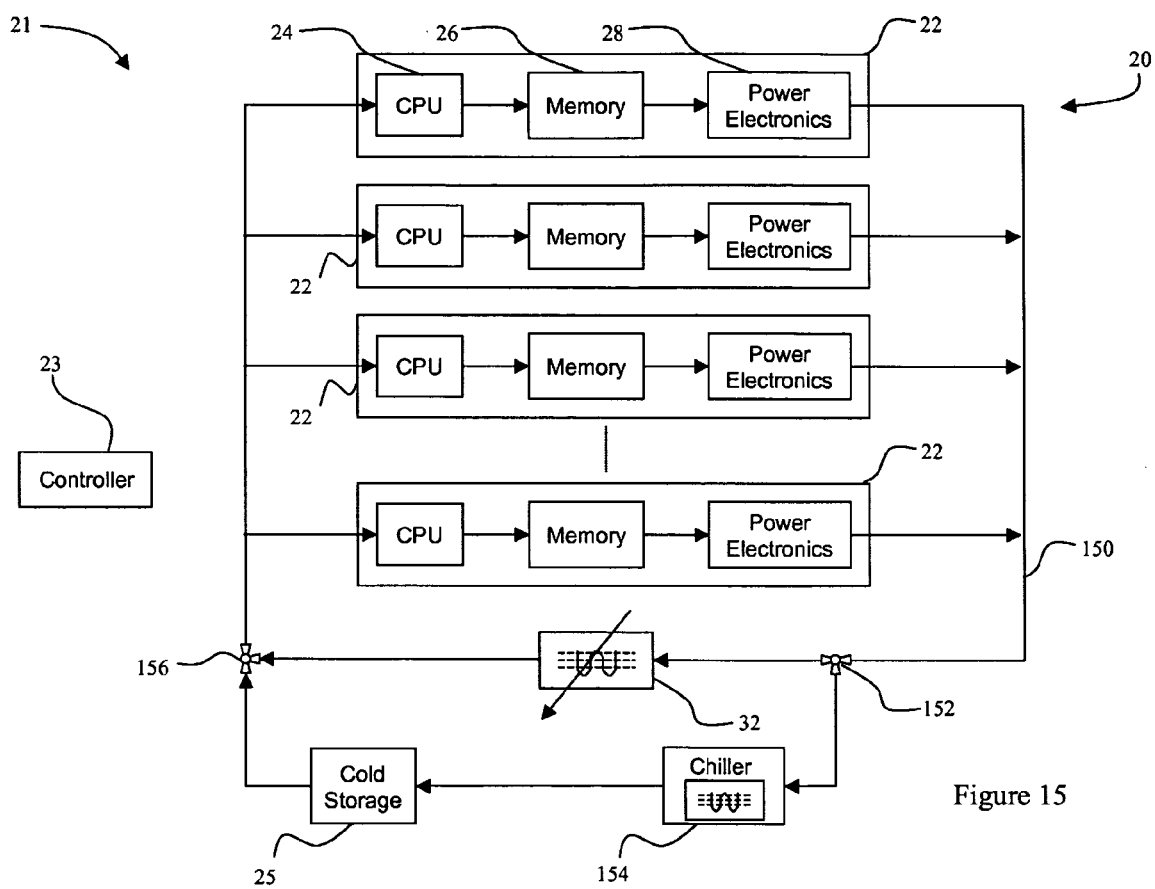
FIG. 15 is a schematic illustration of an alternate embodiment server system having a supplemental chiller.

A flow chart illustrating an exemplary logic sequences for operation of the cooling system 30 for server system 21 is shown in FIG. 15. The sequence starts with the controller 23 monitoring the server system 21 loads and operating conditions in block 132. The process then proceeds to decision block 134 that compares the current server system load to a predefined threshold L1. The threshold L1 may be defined in any manner which indicates the level of utilization of computer systems 22. For example, the level of electrical power consumed by the computer systems 22 may indicate the level of utilization. If the threshold L1 is exceeded, the process proceeds to decision block 136 where the coolant temperature is compared to a threshold temperature. Due to the thermal mass of the cooling system 30, an increase in load on the server system 21 may not immediately impact the performance of the cooling system 30. If the threshold has not been exceeded, the process loops back to start block 131. If decision block 136 returns a negative and the coolant temperature reaches a threshold, the process proceeds to block 138 where coolant is released from cold battery 25 into the coolant system 30 by the opening of valve 27. Controller 23 also communicates with the operating system of computers to either delay fast load conditions changes or to receive advanced information of load changes to match the load conditions to the time constants of the actuation devices.

If decision block 134 returns a negative, meaning the load threshold L1 has not been exceeded, the process proceeds to block 140 to determine if the server system 21 load is below a threshold L2. The threshold L2 indicates that the cooling system 30 includes an overcapacity that may be stored in cold battery 25 for later use. If decision block 140 returns an affirmative, the controller 21 diverts coolant from the coolant system 30 into cold battery 25 in block 142 by opening or modulating valve 29 for example. If decision block 14 returns a negative, the process proceeds to block 144 where heat exchanger 32 decreases the coolant temperature using the ambient air free cooling temperature. The process then proceeds back to start block 131 to repeat the process.

Another embodiment of data center 20 with server system 21 is illustrated in FIG. 15. In this embodiment, the computer systems 22 are coupled to a liquid cooling system 150 in a similar manner as described above with respect to FIG. 1. The cooling system 150 absorbs thermal energy from the computer systems 22 and transfers the heated coolant to heat exchanger 32. The heat exchanger 32 is coupled to the cooling system 150 to remove thermal energy, through a roof cooler for example, before the transferring the coolant back to the computer systems 22 to repeat the process.

Controller 23 provides control functionality for the cooling system 150 and is also operably coupled to a valve 152 that is positioned in cooling system 150 before to the heat exchanger 32. During periods when the thermal load of the computer systems 22 is low, the controller 23 may route some or all of the coolant to a chiller 154. The chiller 154 lowers the temperature of the coolant, to 20° C. for example, before storing the coolant in cold storage 25. During periods of high thermal load, the controller 23 may route coolant from cold storage 25 via valve 156. This embodiment provides advantages of increasing the cooling capacity of the cooling system 150. Further, since the chiller 154 is operated for only a short period of time, the efficiency impact of the additional equipment is smaller than the prior art system that required the continuous use of a chiller. Further, in some embodiments, the efficiency loss through using the chiller 154 is offset by the increased performance of the computer systems 22 during peak loading periods.

Figure 16:
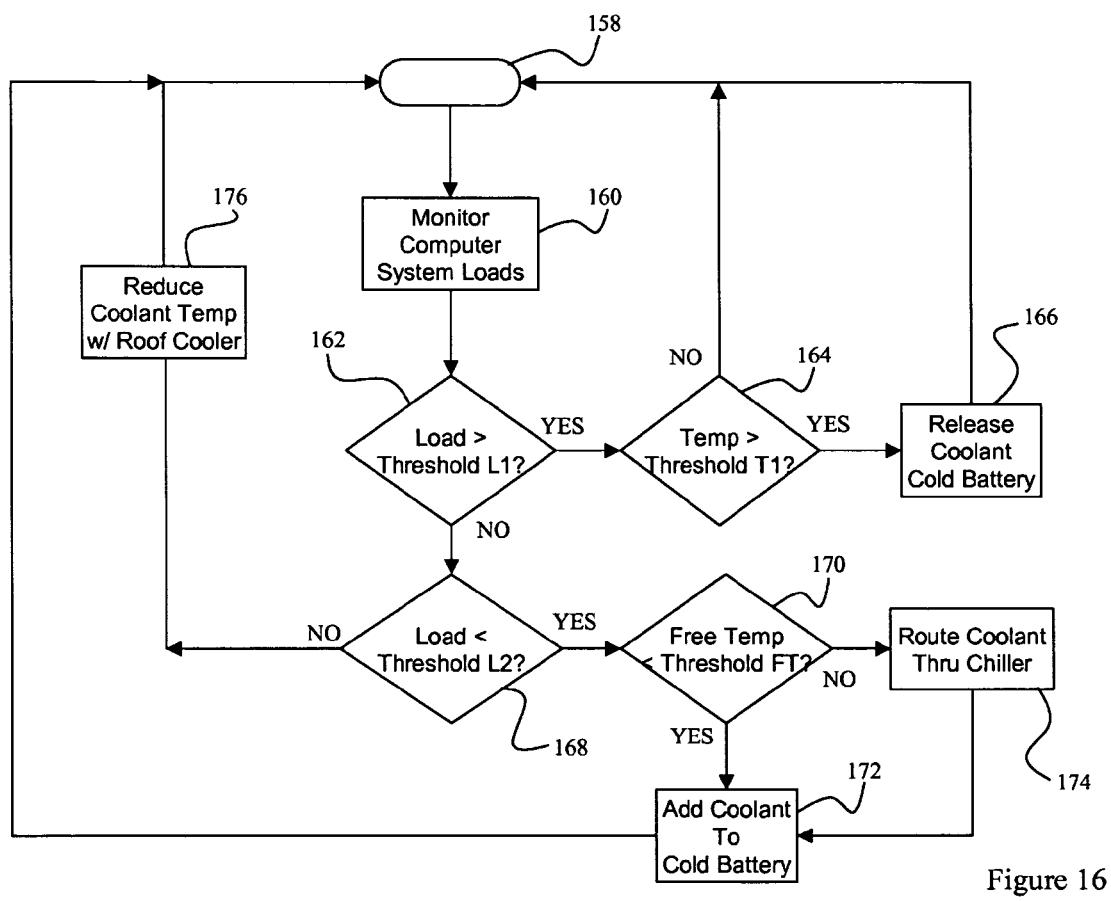
FIG. 16 is a flow chart illustrating the operation of the cooling system for the server system of FIG. 15.

A flow chart illustrating an exemplary logic sequences for operation of the cooling system 150 for server system 21 is shown in FIG. 16. The sequence starts with the controller 23 monitoring the server system 21 loads and operating conditions in block 160. Once the loading of the server system 21 is ascertained, the process moves to decision block 162 to determine if the load on the computer systems is above a threshold L1. If block 162 returns a positive, the process proceeds to block 164 where it is determined if the coolant temperature is above a threshold T1, indicating that additional cooling capacity is required due to the computer system 22 loads. If block 164 returns a positive response, the cooling system 150 releases coolant stored in cold battery 25 in block 166. If block 164 returns a negative response, the process loops back to start block 158 to repeat the process.

If block 162 returns a negative response, indicating that the server system 21 is not in a peak period, the process proceeds to decision block 168. Block 168 determines if the load on the server system 21 is below a threshold L2. Threshold L2 indicates that there may be additional cooling capacity in the cooling system 150 that may be stored for later use. If block 168 returns a negative response, the process cools the coolant with a cooler, such as a roof cooler for example, in block 176 and then loops back to start block 158.

If block 168 returns a positive response, the process proceeds to decision block 170 that determines if there is sufficient free cooling temperature to reduce the coolant to a desired storage temperature. If block 170 returns a positive response, then the process stores the coolant in block 172 and loops back to start block 158. If block 170 returns a negative response, the coolant is routed through a chiller in block 174 to further lower the coolant temperature before storing the coolant in block 172.

Figure 17:
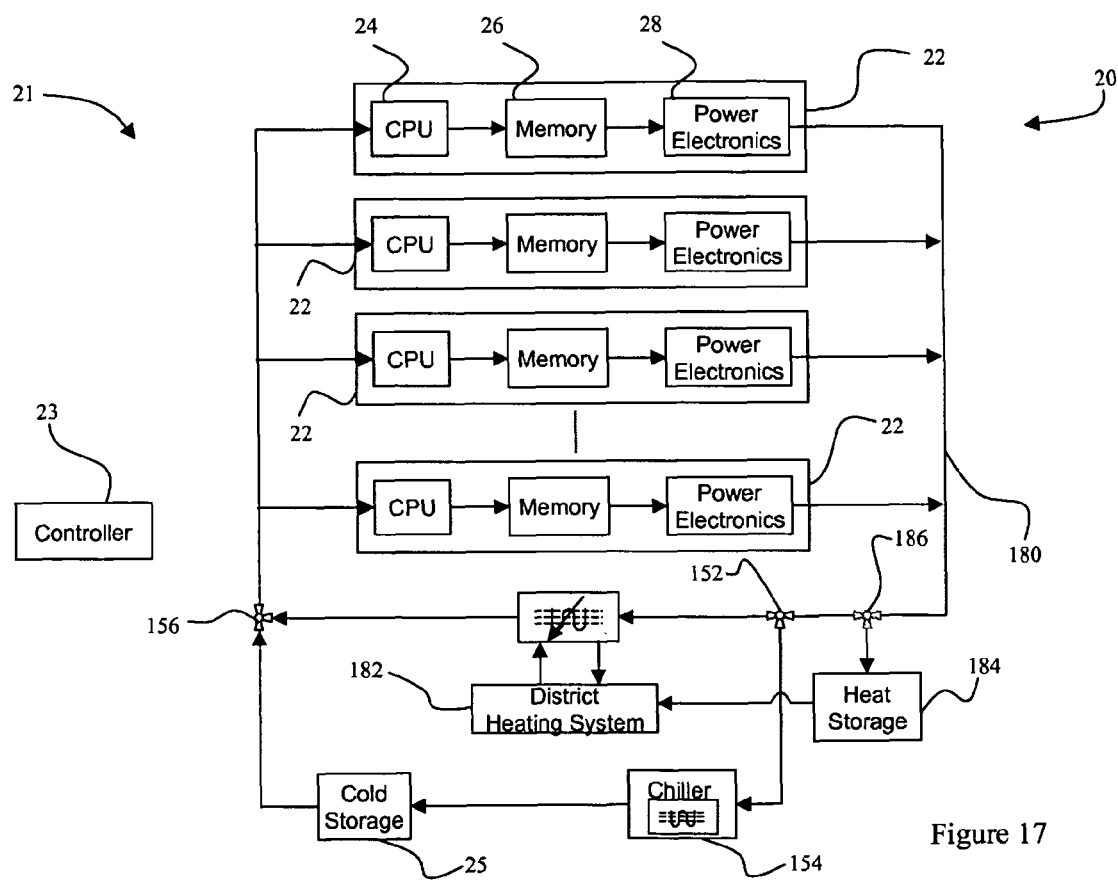
FIG. 17 is a schematic illustration of a server system coupled with a district heating system with supplemental heat storage to minimize total carbon emissions; and, FIG. 18 is a flow chart illustrating the operation of the thermal energy management system of FIG. 17.

Another alternate embodiment data center 20 with server system 21 is illustrated in FIG. 17. This embodiment includes a liquid cooling system 180 that is arranged in the manner discussed above with respect to FIG. 15. The cooling system 180 routes a coolant through computer systems 22 where thermal energy is absorbed. The heated coolant is passed through heat exchanger 32 where the thermal energy from the computer systems 22 is removed. The chiller 154 and cold battery 25 are arranged to store coolant for periods of peak loads as described above.

The heat exchanger 32 is further coupled to a district heating system 182 to receive the thermal energy that was generated by the computer systems 22. The district heating system 182 uses the thermal energy to providing heating for residential or commercial facilities. Alternatively, district-heating system 182 may utilize the thermal energy as process heat in an industrial facility. Cooling system 180 further includes a heat storage, or hot battery 184. The hot battery 184 is coupled between a valve 186 and the district heating system 182. During operation, the controller 23 may determine that some of the thermal energy generated by the computer systems 22 is available for later use by the district heating system 182. For example, the controller may remove heated coolant generated during peak time periods during the day and then release the thermal energy from hot battery 184 to the district heating system 182 during the evening. This may correspond to times when thermal demand from the district heating system 182 is high, but the heat generated by the computer systems 22 is low.

Figure 18:
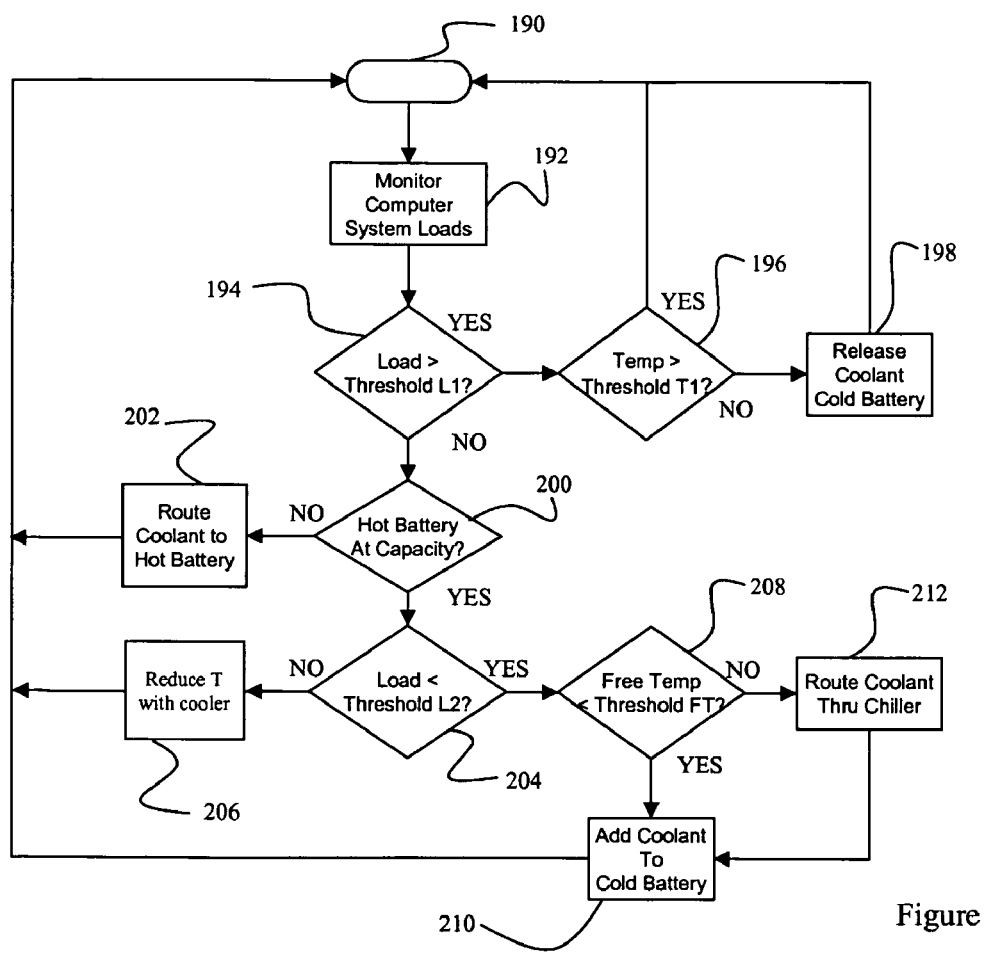

A flow chart illustrating an exemplary logic sequences for operation of the cooling system 180 for server system 21 is shown in FIG. 18. The sequence starts with the controller 23 monitoring the server system 21 loads and operating conditions in block 192. Once the loading of the server system 21 is ascertained, the process moves to decision block 194 to determine if the load on the computer systems is above a threshold L1. If block 194 returns a positive, the process proceeds to block 196 where it is determined if the coolant temperature is above a threshold T1, indicating that additional cooling capacity is required due to the computer system 22 loads. If block 196 returns a positive response, the cooling system 180 releases coolant stored in cold battery 25 in block 198. If block 196 returns a negative response, the process loops back to start block 190 to repeat the process.

If decision block 194 returns a negative, the process proceeds to decision block 200 where it is determined if the hot battery 184 is at its thermal capacity. If the hot battery can absorb additional thermal energy, block 200 returns a positive and proceeds to block 202. Block 202 stores the coolant, or the thermal energy from the coolant, in hot battery 184 and then loops back to start block 190. If block 200 returns a positive, then the process proceeds to block 204 which determines if the load on the server system 21 is less than a threshold L2. If the load is less than threshold L2, the process proceeds to block 206 where the thermal energy is dissipated with a cooler, such as a roof cooler, before looping back to start block 190.

If block 204 returns a positive response, the process proceeds to decision block 208 that determines if there is sufficient free cooling temperature to reduce the coolant to a desired storage temperature. If block 208 returns a positive response, then the process stores the coolant in block 210 and loops back to start block 190. If block 170 returns a negative response, the coolant is routed through chiller 154 in block 212 to further lower the coolant temperature before storing the coolant in block 210.

The capabilities of the embodiments disclosed herein can be implemented in software, firmware, hardware or some combination thereof. As one example, one or more aspects of the embodiments disclosed can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the disclosed embodiments can be provided.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention.

What is claimed is:

1. A server system comprising:
    a computer system, said computer system having a processor operable at a first speed at a first temperature and at a second speed at a second temperature;
    a liquid cooling system fluidly coupled to said processor, said liquid cooling system containing a liquid coolant;
    a coolant control device coupled to said liquid cooling system, said coolant control device arranged to control said flow of coolant to said processor;
    a heat exchanger coupled to said liquid cooling system;
    a cold battery coupled to said liquid cooling system; and,
    a controller operably coupled to said heat exchanger and said cold battery, wherein said controller is responsive to executable computer instructions to transfer coolant to and from said cold battery in response to a signal indicating said processor is switching between said first speed and said second speed.

2. The server system of claim 1 wherein said first temperature is less than said second temperature.

3. The server system of claim 2 wherein said cold battery stores coolant at a third temperature, wherein said third temperature is equal to or less than said first temperature.

4. The server system of claim 3 wherein said third temperature is 30° C. lower than said first temperature.

5. The server system of claim 1 wherein said controller is further responsive to executable computer instructions to transfer coolant to said cold battery in response to a signal indicating that said processor is operating at said second speed.

6. The server system of claim 1 wherein said controller is further responsive to executable computer instructions to transfer coolant to said cold battery during defined portions of a day.

7. The server system of claim 1 further comprising a hot battery coupled to said coolant system.

8. The server system of claim 7 further comprising a district heating system coupled to said heat exchanger and said hot battery.

9. A method of operating a server system comprising:
    operating a plurality of computer systems in a first mode of operation wherein said plurality of computer systems generate a first thermal load;
    operating said plurality of computer systems in a second mode of operation wherein said plurality of computer systems generate a second thermal load;
    transferring a coolant to said plurality of computer systems at a first flow rate and first temperature when said plurality of computer systems are operating in said first mode;
    transferring said coolant to said computer systems at a second flow rate and second temperature when said plurality of computer systems are operating in said second mode; and,
    transferring said coolant from a cold battery when said plurality of computer systems are operating in said first mode.

10. The method of claim 9 further comprising the step of transferring said coolant to said cold battery when said plurality of computer systems are operating in said second mode.

11. The method of claim 10 further comprising the steps of:
    determining a power requirement of said plurality of computer systems;
    determining an expected demand for processing services;
    determining a cost of energy;
    determining a price of output heat; and,
    switching said plurality of computer systems between said first mode and said second mode based on a balancing of said power requirements, said expected demand, said cost of energy and said price of output heat.

12. The method of claim 10 further comprising the step of transferring thermal energy from said coolant to a consumer of thermal energy.

13. The method of claim 12 further comprising the step of transferring said coolant to a hot battery.

14. The method of claim 13 further comprising the step of transferring thermal energy from said hot battery to said consumer of thermal energy.

15. A method of operating a server system comprising:
    determine a demand for processing services;
    operating a plurality of computer systems at a first mode of operation when said demand for processing services is above a first threshold, wherein said plurality of computer systems requires coolant at a first temperature when operating in said first mode;
    operating said plurality of computer systems at a second mode operation when said demand for processing services is below said first threshold, wherein said plurality of computer systems can operate with a coolant at a second temperature when operating is said second mode;
    transferring coolant to said plurality of computer systems;

changing said temperature of said coolant in response to said plurality of computer systems changing between said first mode of operation and said second mode of operation.

16. The method of claim 15 wherein said coolant temperature is changed by the step of injecting coolant from a cold battery.

17. The method of claim 16 further comprising the step of transferring thermal energy from said coolant to a district heating system.

18. The method of claim 17 further comprising the step of transferring a portion of said coolant exiting said plurality of computer systems to a hot battery.

19. The method of claim 18 further comprising the step of transferring thermal energy from said hot battery to said district heating system.

20. The method of claim 19 further comprising the step of adjusting said coolant temperature prior to said plurality of computer systems changing from said first mode to said second mode the load change in computing power, to avoid thermal spikes in case of high performance cold plates with a thermal time constant smaller than the time constant of the cooling loop actuators.

* * * * *